(12) United States Patent
Sun et al.

(10) Patent No.: US 10,979,057 B1
(45) Date of Patent: Apr. 13, 2021

(54) DELAY LOCK LOOP AND PHASE LOCKING METHOD THEREOF

(71) Applicant: Winbond Electronics Corp., Taichung (TW)

(72) Inventors: Chi-Hsiang Sun, Taichung (TW); Shih-Nung Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/024,672

(22) Filed: Sep. 17, 2020

(51) Int. Cl.
*H03L 7/081* (2006.01)
*H03L 7/085* (2006.01)

(52) U.S. Cl.
CPC ............ *H03L 7/0816* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 7,746,181 B1 * | 6/2010 | Moyal ....................... | H03L 7/18 331/44 |
| 7,936,196 B2 | 5/2011 | Kim et al. | |
| 8,536,916 B1 * | 9/2013 | van Engelen ........... | H03L 7/099 327/159 |
| 8,564,341 B2 | 10/2013 | Kim | |
| 9,998,129 B1 * | 6/2018 | Zhuang ................. | H03L 7/0992 |
| 10,404,261 B1 * | 9/2019 | Josefsberg .............. | H03L 7/091 |
| 2004/0008063 A1 * | 1/2004 | Kim .......................... | H03L 7/16 327/158 |
| 2004/0212410 A1 * | 10/2004 | Ghazali ..................... | H03L 7/18 327/156 |
| 2006/0132202 A1 * | 6/2006 | Meltzer ..................... | H03L 7/23 327/156 |
| 2008/0129353 A1 * | 6/2008 | Lin .......................... | H03L 7/087 327/157 |
| 2009/0091362 A1 * | 4/2009 | Pellerano .............. | H03L 7/0812 327/158 |
| 2010/0013530 A1 * | 1/2010 | Kim ...................... | H03L 7/0812 327/149 |
| 2012/0326758 A1 * | 12/2012 | De Foucauld ........ | H03L 7/0812 327/156 |
| 2016/0233870 A1 * | 8/2016 | Van Engelen ............ | H03L 7/18 |

(Continued)

FOREIGN PATENT DOCUMENTS

KR 100673135 1/2007

*Primary Examiner* — Adam D Houston
(74) *Attorney, Agent, or Firm* — JCIPRNET (57) ABSTRACT

A delay lock loop and a phase locking method thereof are provided. The delay lock loop includes a first divider, a delay line, a frequency multiplier, a second divider, a phase detection and controlling circuit and a setting signal generator. The first divider generates a divided reference clock signal. The second divider generates a first feedback clock signal and a second feedback clock signal which are complementary by dividing an output clock signal, and generates a selected feedback clock signal by selecting the first or second feedback clock signal according to a setting signal. The phase detection and controlling circuit compares phases of the selected feedback clock signal and the divided reference clock signal to generate a delay control signal. The setting signal generator samples the divided reference clock signal by the first feedback clock signal to generate the setting signal.

13 Claims, 6 Drawing Sheets

(56) References Cited

U.S. PATENT DOCUMENTS

| | | | |
|---|---|---|---|
| 2017/0288686 A1* | 10/2017 | Gao | H03L 7/081 |
| 2017/0366191 A1* | 12/2017 | Wang | H03L 7/0814 |
| 2019/0165792 A1* | 5/2019 | Huh | H03L 7/0816 |
| 2019/0393920 A1* | 12/2019 | Waheed | H03L 7/0802 |
| 2020/0228018 A1* | 7/2020 | Wiktor | H02M 3/158 |
| 2020/0286574 A1* | 9/2020 | Kunz | G01R 19/16552 |
| 2020/0373927 A1* | 11/2020 | Liang | H03L 7/18 |
| 2020/0379412 A1* | 12/2020 | Balakrishnan | G06F 1/08 |
| 2021/0028789 A1* | 1/2021 | Kuan | H03L 7/097 |

\* cited by examiner

DELAY LOCK LOOP AND PHASE LOCKING METHOD THEREOF

BACKGROUND

Technical Field

The disclosure relates to a delay lock loop and a phase locking method thereof, and more particularly relates to a delay lock loop applied to a memory chip and a phase locking method thereof.

Description of Related Art

As technology advances, the frequency of the working clock of the dynamic random access memory will continue to increase in the future. Therefore, it is expected that a large number of circuits may be controlled by frequency reduction to improve the performance and yield of the chip. For the delay lock loop (DLL) in the dynamic random access memory, frequency reduction control also helps to improve the performance. However, due to the limitation of the locking mechanism of the delay lock loop, the delay line therein needs to provide extra delay. Consequently, the current consumption and the lock time also increase, which reduces the working efficiency of the dynamic random access memory.

SUMMARY

The disclosure provides a delay lock loop and a phase locking method thereof, which reduce the number of delay elements required by a delay line and reduce power consumption.

The delay lock loop of the disclosure includes: a first divider, a delay line, a frequency multiplier, a second divider, a phase detection and controlling circuit, and a setting signal generator. The first divider generates a divided reference clock signal by dividing a reference clock signal. The delay line receives the divided reference clock signal and a delay control signal, and generates a first output clock signal by delaying the divided reference clock signal according to the delay control signal. The frequency multiplier generates a second output clock signal by multiplying a frequency of the first output clock signal. The second divider generates a first feedback clock signal and a second feedback clock signal which are complementary by dividing the second output clock signal, and generates a selected feedback clock signal by selecting one of the first feedback clock signal and the second feedback clock signal according to a setting signal. The phase detection and controlling circuit generates the delay control signal by comparing phases of the selected feedback clock signal and the divided reference clock signal. The setting signal generator samples the divided reference clock signal by the first feedback clock signal to generate a sampling result, and generates the setting signal according to the sampling result.

The phase locking method of the disclosure includes: generating a divided reference clock signal by dividing a reference clock signal; generating a first output clock signal by delaying the divided reference clock signal according to a delay control signal; generating a second output clock signal by multiplying a frequency of the first output clock signal; generating a first feedback clock signal and a second feedback clock signal which are complementary by dividing the second output clock signal, and generating a selected feedback clock signal by selecting one of the first feedback clock signal and the second feedback clock signal according to a setting signal; generating the delay control signal by comparing phases of the selected feedback clock signal and the divided reference clock signal; and sampling the divided reference clock signal by the first feedback clock signal to generate a sampling result, and generating the setting signal according to the sampling result.

Based on the above, according to the disclosure, the divided reference clock signal is sampled by the selected feedback clock signal of the lock loop, and one of the complementary first and second feedback clock signals, which has a phase closer to the divided reference clock signal, is selected according to the sampling result to perform the operation of phase locking with the divided reference clock signal. Thereby, the delay value provided by the delay line in the delay lock loop is reduced to effectively reduce the required power consumption. Moreover, the speed of phase locking is increased to improve the efficiency of the system.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
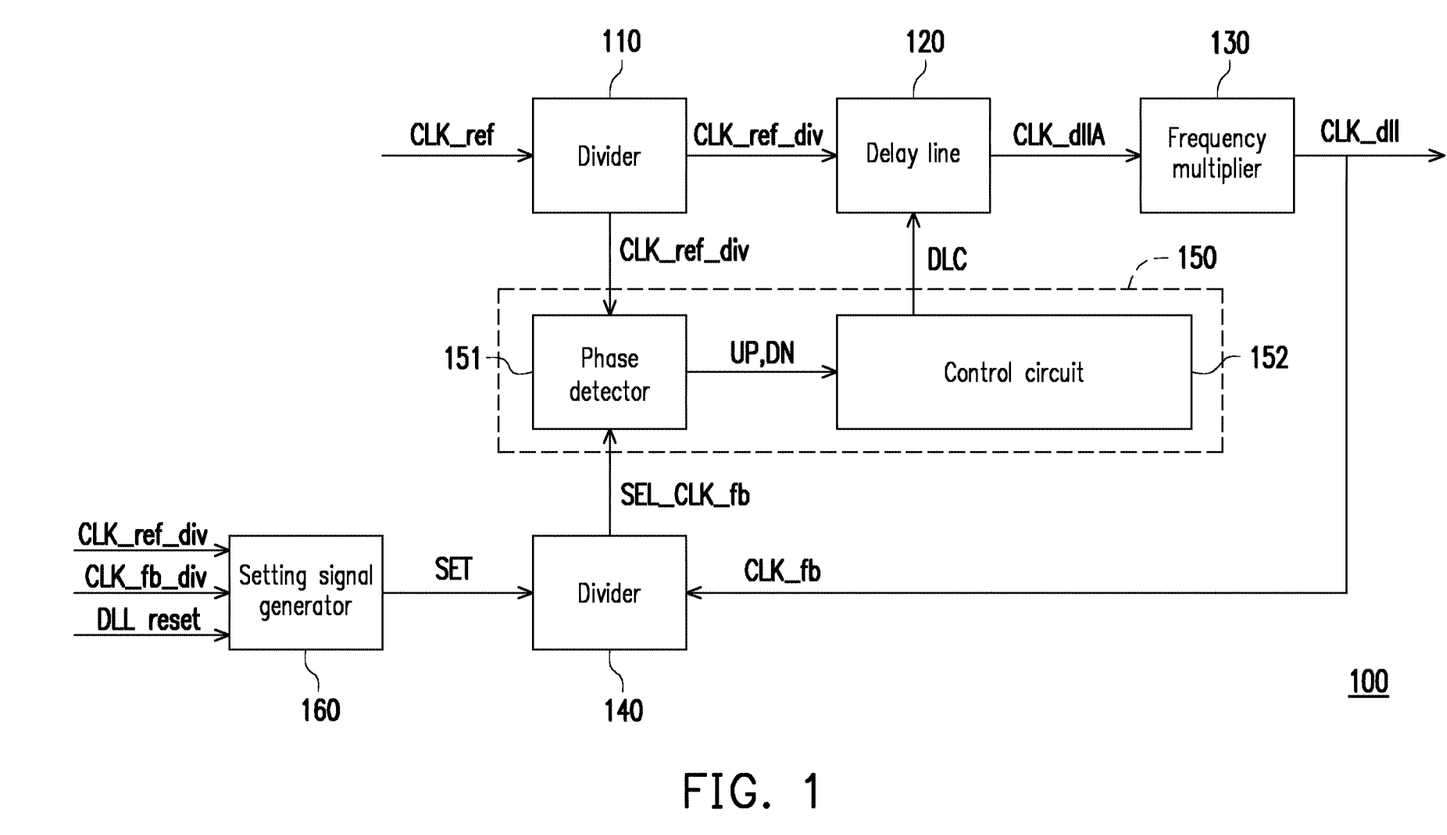
FIG. 1 is a schematic diagram of the delay lock loop according to an embodiment of the disclosure.

Referring to FIG. 1, FIG. 1 is a schematic diagram of a delay lock loop according to an embodiment of the disclosure. The delay lock loop 100 includes dividers 110 and 140, a delay line 120, a frequency multiplier 130, a phase detection and controlling circuit 150, and a setting signal generator 160. The divider 110 receives the reference clock signal CLK_ref, and generates the divided reference clock signal CLK_ref_div by dividing the reference clock signal CLK_ref. The delay line 120 is coupled to the divider 110, and receives the divided reference clock signal CLK_ref_div. The delay line 120 provides a delay value according to the delay control signal DLC to delay the divided reference clock signal CLK_ref_div, and thereby generates the output clock signal CLK_dllA. The frequency multiplier 130 is coupled to the delay line 120, and receives and multiplies the frequency of the first output clock signal CLK_dllA, and thereby generates another output clock signal CLK_dll. The frequency of the output clock signal CLK_dll may be any real multiple of the first output clock signal CLK_dllA.

In addition, in this embodiment, the divider 140 may receive the output clock signal CLK_fb which is the same as the second output clock signal CLK_dll, and divide the output clock signal CLK_fb to generate the selected feedback clock signal SEL_CLK_fb. Specifically, the divider 140 generates the first feedback clock signal CLK_fb_div and the second feedback clock signal CLK_fb_div_n which is complementary in phase to the first feedback clock signal CLK_fb_div by dividing the output clock signal CLK_fb. The divider 140 may generate the first feedback clock signal CLK_fb_div by dividing the output clock signal CLK_fb, and generate the second feedback clock signal CLK_fb_div_n by inverting the first feedback clock signal CLK_fb_div. Further, the divider 140 may generate the selected feedback clock signal SEL_CLK_fb by selecting one of the first feedback clock signal CLK_fb_div and the second feedback clock signal CLK_fb_div_n according to the setting signal SET.

The setting signal generator 160 receives the first feedback clock signal CLK_fb_div, the divided reference clock signal CLK_ref_div, and the delay lock loop reset signal DLL_reset. The setting signal generator 160 samples the divided reference clock signal CLK_ref_div by the first feedback clock signal CLK_fb_div to generate a sampling result, and generates the setting signal SET according to the generated sampling result, and the setting signal SET is transmitted to the divider 140.

In addition, the phase detection and controlling circuit 150 is coupled to the dividers 110 and 140. The phase detection and controlling circuit 150 includes a phase detector 151 and a control circuit 152. The phase detector 151 receives the selected feedback clock signal SEL_CLK_fb and the divided reference clock signal CLK_ref_div. The phase detector 151 performs a detection operation of the phase difference between the selected feedback clock signal SEL_CLK_fb and the divided reference clock signal CLK_ref_div to generate detection results UP and DN. The control circuit 152 is coupled to the phase detector 151, and generates the delay control signal DLC according to the detection results UP and DN indicating that the phase of the selected feedback clock signal SEL_CLK_fb is ahead or behind the phase of the divided reference clock signal CLK_ref_div.

In this embodiment, when the selected feedback clock signal SEL_CLK_fb is the first feedback clock signal CLK_fb_div, the phase detector 151 performs a phase alignment operation on the divided reference clock signal CLK_ref_div and the first feedback clock signal CLK_fb_div. When the selected feedback clock signal SEL_CLK_fb is the second feedback clock signal CLK_fb_div_n, the phase detector 151 performs the phase alignment operation on the divided reference clock signal CLK_ref_div and the second feedback clock signal CLK_fb_div_n.

Specifically, the setting signal generator 160 samples the divided reference clock signal CLK_ref_div by the first feedback clock signal CLK_fb_div to determine whether the rising edge (or falling edge) of the divided reference clock signal CLK_ref_div is closer to the rising edge (or falling edge) of the first feedback clock signal CLK_fb_div or closer to the rising edge (or falling edge) of the second feedback clock signal CLK_fb_div_n, and generates the setting signal SET accordingly. Through the setting signal SET, the divider 140 may select to output the selected feedback clock signal SEL_CLK_fb whose rising edge (or falling edge) is closer to the rising edge (or falling edge) of the divided reference clock signal CLK_ref_div, for the phase detector 151 to perform the operation of detecting the phase difference with the divided reference clock signal CLK_ref_div. Thereby, the delay line 120 does not need to provide an excessively large delay value, which reduces current consumption and increases the locking speed.

Figure 2:
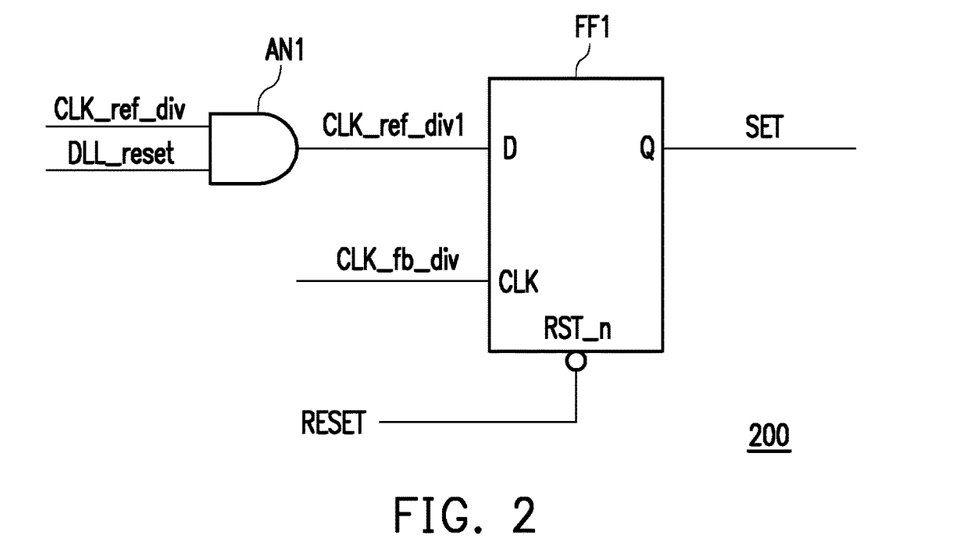
FIG. 2 is a schematic diagram of the setting signal generator according to an embodiment of the disclosure.

Referring to FIG. 2, FIG. 2 is a schematic diagram of the setting signal generator according to an embodiment of the disclosure. The setting signal generator 200 includes a flip-flop FF1 and an AND gate AN1. The AND gate AN1 receives the divided reference clock signal CLK_ref_div and the delay lock loop reset signal DLL_reset. When the delay lock loop reset signal DLL_reset is at the high logic level, the AND gate AN1 generates the reference signal CLK_ref_div1 equal to the divided reference clock signal CLK_ref_div to the data end D of the flip-flop FF1. In contrast, when the delay lock loop reset signal DLL_reset is at the low logic level, the divided reference clock signal CLK_ref_div is shielded and not provided to the data end D of the flip-flop FF1. In addition, the clock end CLK of the flip-flop FF1 receives the first feedback clock signal CLK_fb_div, and performs a sampling operation on the reference signal CLK_ref_div1 according to the rising edge of the first feedback clock signal CLK_fb_div.

The setting signal generator 200 generates the setting signal SET according to the sampling result obtained by the output end Q of the flip-flop FF1. When the high logic level of the divided reference clock signal CLK_ref_div is sampled by the rising edge of the first feedback clock signal CLK_fb_div, the setting signal generator 200 may generate the setting signal SET at the high logic level. In contrast, when the low logic level of the divided reference clock signal CLK_ref_div is sampled by the rising edge of the first feedback clock signal CLK_fb_div, the setting signal generator 200 may generate the setting signal SET at the low logic level.

In addition, the flip-flop FF1 is a D-type flip-flop. The flip-flop FF1 has a reset end RST_n to receive the reset signal RESET. The flip-flop FF1 may reset the setting signal SET to the low logic level according to the reset signal RESET at the low logic level.

Figure 3A:
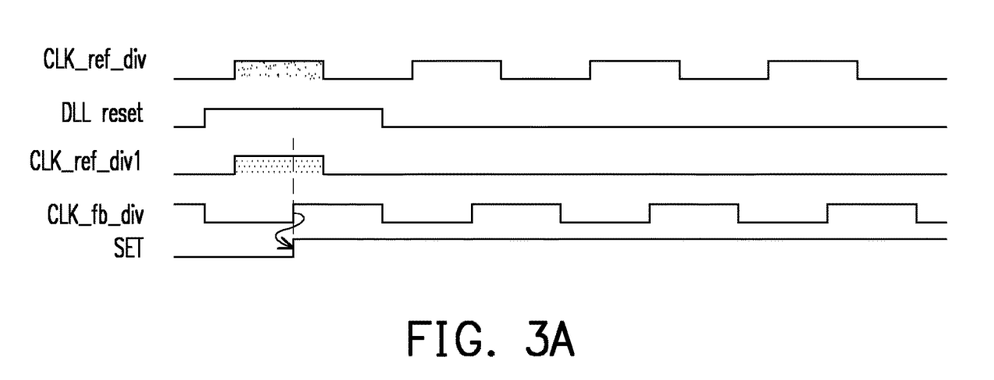
FIG. 3A and FIG. 3B are operation waveform diagrams of the setting signal generator.
Figure 3B:
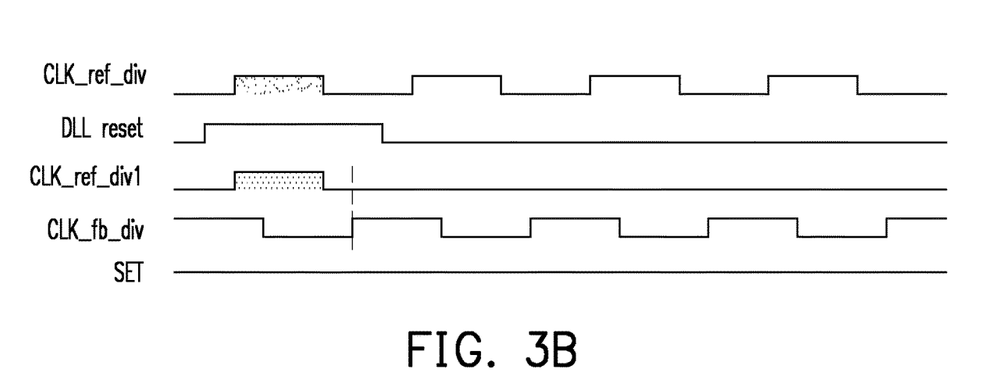

Referring to FIG. 2, FIG. 3A, and FIG. 3B, FIG. 3A and FIG. 3B are operation waveform diagrams of the setting signal generator. In FIG. 3A, when the delay lock loop reset signal DLL_reset is at the high logic level, the reference signal CLK_ref_div1 and the divided reference clock signal CLK_ref_div have the same positive pulse wave. By sampling the reference signal CLK_ref_div1 by the rising edge of the divided reference clock signal CLK_ref_div, the setting signal SET at the high logic level is generated.

In FIG. 3B, similarly, when the delay lock loop reset signal DLL_reset is at the high logic level, the reference signal CLK_ref_div1 and the divided reference clock signal CLK_ref_div have the same positive pulse wave. By sampling the reference signal CLK_ref_div1 by the rising edge of the divided reference clock signal CLK_ref_div, the setting signal SET at the low logic level is generated.

Figure 4:
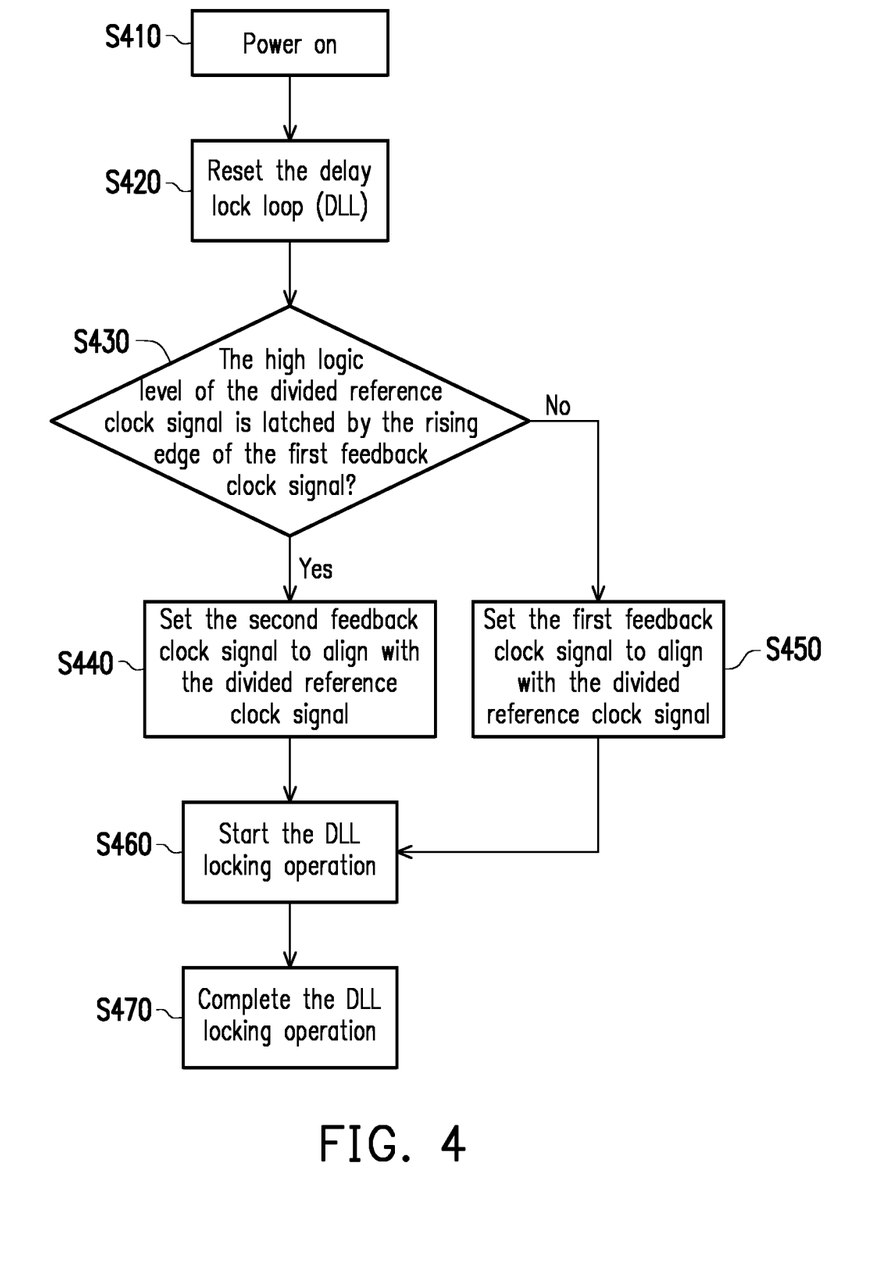
FIG. 4 is a schematic diagram of the locking operation of the delay lock loop according to an embodiment of the disclosure.

Referring to FIG. 4, FIG. 4 is a schematic diagram of the locking operation of the delay lock loop according to an embodiment of the disclosure. In Step S410, power is turned on; and in Step S420, a reset operation is performed on the delay lock loop. Then, the first feedback clock signal is sampled according to the divided reference clock signal, and in Step S430, it is determined whether the high logic level of the first feedback clock signal is latched by the rising edge of the divided reference clock signal. When the determination result is YES, Step S440 is performed. In contrast, when the determination result is NO, Step S450 is performed.

In Step S440, the second feedback clock signal may be set to align the transition edges of the second feedback clock signal with the transition edges of the divided reference clock signal, and thereby the locking operation of the delay lock loop (DLL) is started in Step S460. In Step S450, the first feedback clock signal may be set to align the transition edges of the first feedback clock signal with the transition edges of the divided reference clock signal, and thereby the DLL locking operation is started in Step S460. Finally, the DLL locking operation is completed in Step S470.

Figure 5A:
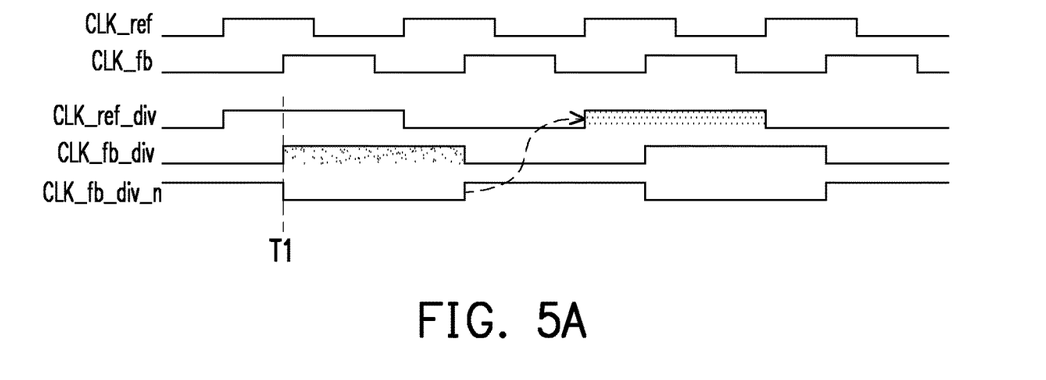
FIG. 5A to FIG. 5C are waveform diagrams of the locking operation of the delay lock loop according to different embodiments of the disclosure.
Figure 5B:
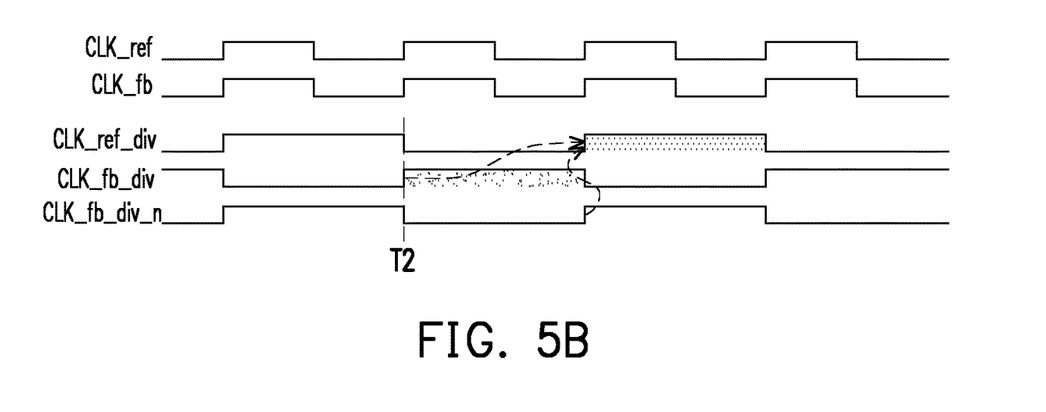
Figure 5C:
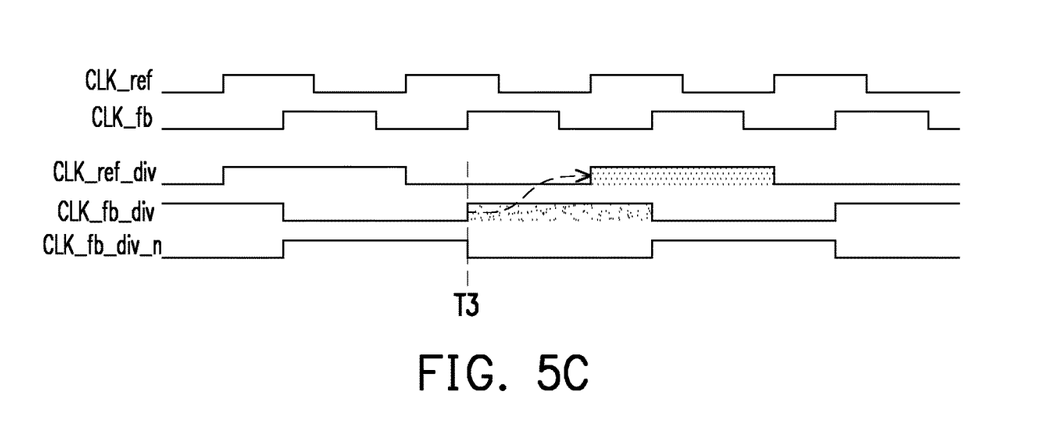

Hereinafter, referring to FIG. 5A to FIG. 5C, FIG. 5A to FIG. 5C are waveform diagrams of the locking operation of the delay lock loop according to different embodiments of the disclosure. In FIG. 5A, the reference clock signal CLK_ref and the output clock signal CLK_fb have a phase difference. The first feedback clock signal CLK_fb_div and the second feedback clock signal CLK_fb_div_n may be generated by dividing the output clock signal CLK_fb. The divided reference clock signal CLK_ref_div may be obtained by dividing the reference clock signal CLK_ref. At the time T1, the divided reference clock signal CLK_ref_div is sampled by the rising edge of the first feedback clock signal CLK_fb_div, so as to latch the divided reference clock signal CLK_ref_div at the high logic level. Therefore, the second feedback clock signal CLK_fb_div_n may be selected to perform the locking operation for phase alignment with the divided reference clock signal CLK_ref_div.

In FIG. 5B, at the time T2, the rising edge of the first feedback clock signal CLK_fb_div corresponds to the transition point of the divided reference clock signal CLK_ref_div. Therefore, the divided reference clock signal CLK_ref_div is sampled by the rising edge of the first feedback clock signal CLK_fb_div, which may latch the divided reference clock signal CLK_ref_div at the high logic level, or the divided reference clock signal CLK_ref_div at the low logic level. Therefore, the first feedback clock signal CLK_fb_div or the second feedback clock signal CLK_fb_div_n may be selected to perform the locking operation for phase alignment with the divided reference clock signal CLK_ref_div.

In FIG. 5C, at the time T3, the divided reference clock signal CLK_ref_div is sampled by the rising edge of the first feedback clock signal CLK_fb_div, which may latch the divided reference clock signal CLK_ref_div at the low logic level. Therefore, the first feedback clock signal CLK_fb_div may be selected to perform the locking operation for phase alignment with the divided reference clock signal CLK_ref_div.

Figure 6:
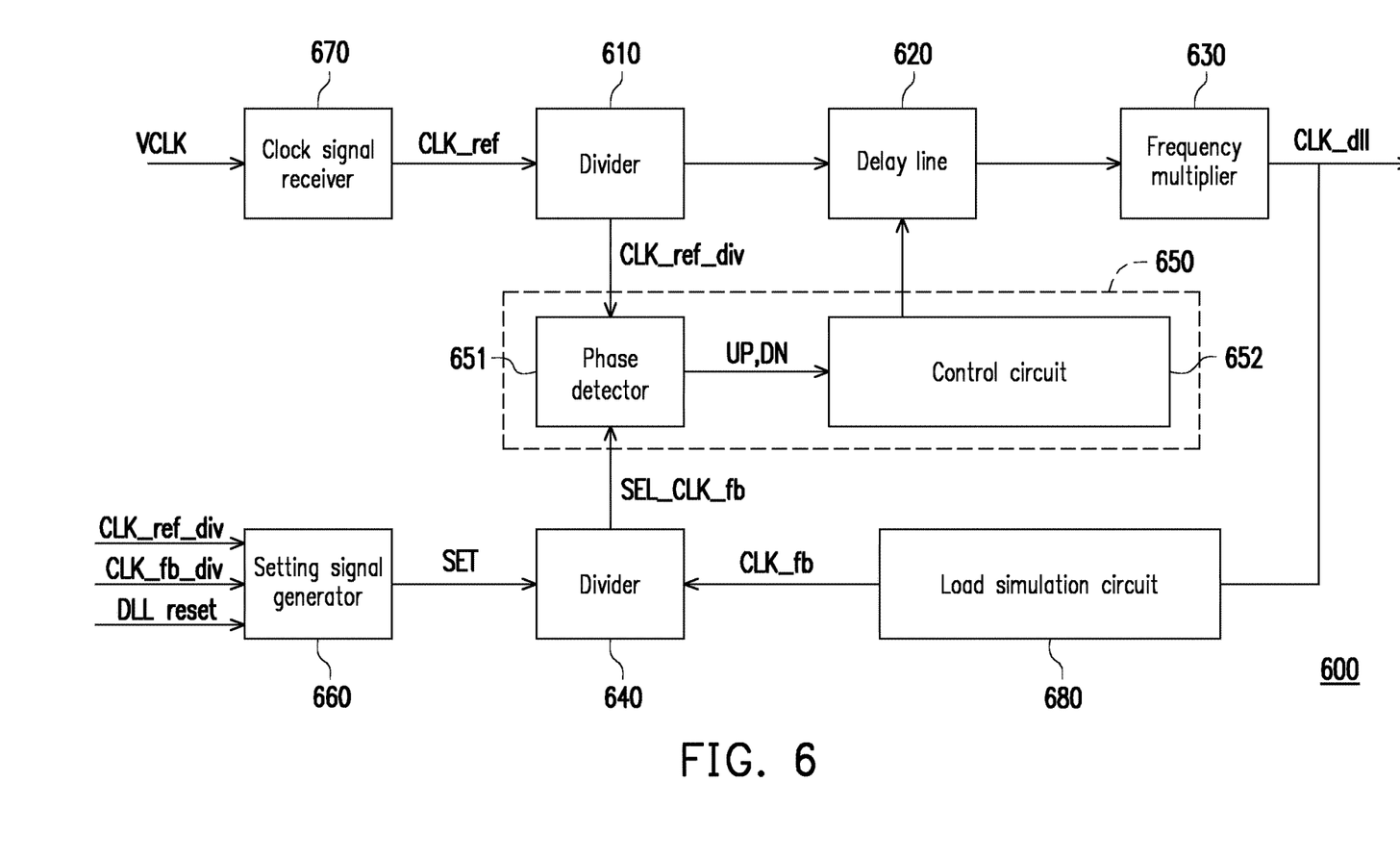
FIG. 6 is a schematic diagram of the delay lock loop according to another embodiment of the disclosure.

Referring to FIG. 6, FIG. 6 is a schematic diagram of the delay lock loop according to another embodiment of the disclosure. The delay lock loop 600 includes dividers 610 and 640, a delay line 620, a frequency multiplier 630, a phase detection and controlling circuit 650, a setting signal generator 660, a clock signal receiver 670, and a load simulation circuit 680. The phase detection and controlling circuit 650 includes a phase detector 651 and a control circuit 652. Different from the embodiment of FIG. 1, the delay lock loop 600 of this embodiment receives the input clock signal VCLK through the clock signal receiver 670, and outputs the reference clock signal CLK_ref. In addition, the output end of the delay lock loop 600 of this embodiment is coupled to the load simulation circuit 680, and passes the output clock signal CLK_dll through the load simulation circuit 680 to generate the output clock signal CLK_fb.

Here, the load simulation circuit 680 is configured to simulate a load connected to the delay lock loop 600 in actual use, and allow the output clock signal CLK_fb to reflect the phase state of the clock signal in actual use, which improves the accuracy of the delay lock loop 600.

In this embodiment, the frequency division numbers provided by the dividers 610 and 640 may be the same, and the frequency multiplication number provided by the frequency multiplier 630 may be the same as the frequency division numbers provided by the dividers 610 and 640.

In addition, in the embodiment of the disclosure, by using the dividers 610 and 640, the situation, in which the rising edge and the falling edge of the reference clock signal CLK_ref cannot be respectively aligned with the output clock signal CLK_fb at the same time when the duty cycle of the reference clock signal CLK_ref is not 50-50, may be prevented.

Regarding the hardware architecture, the dividers 610 and 640, the delay line 620, the frequency multiplier 630, the phase detection and controlling circuit 650, the clock signal receiver 670, and the load simulation circuit 680 in the embodiment of the disclosure may be implemented using any circuit architecture known to those having ordinary knowledge in the field of delay lock loop, and there is no particular limitation.

Figure 7:
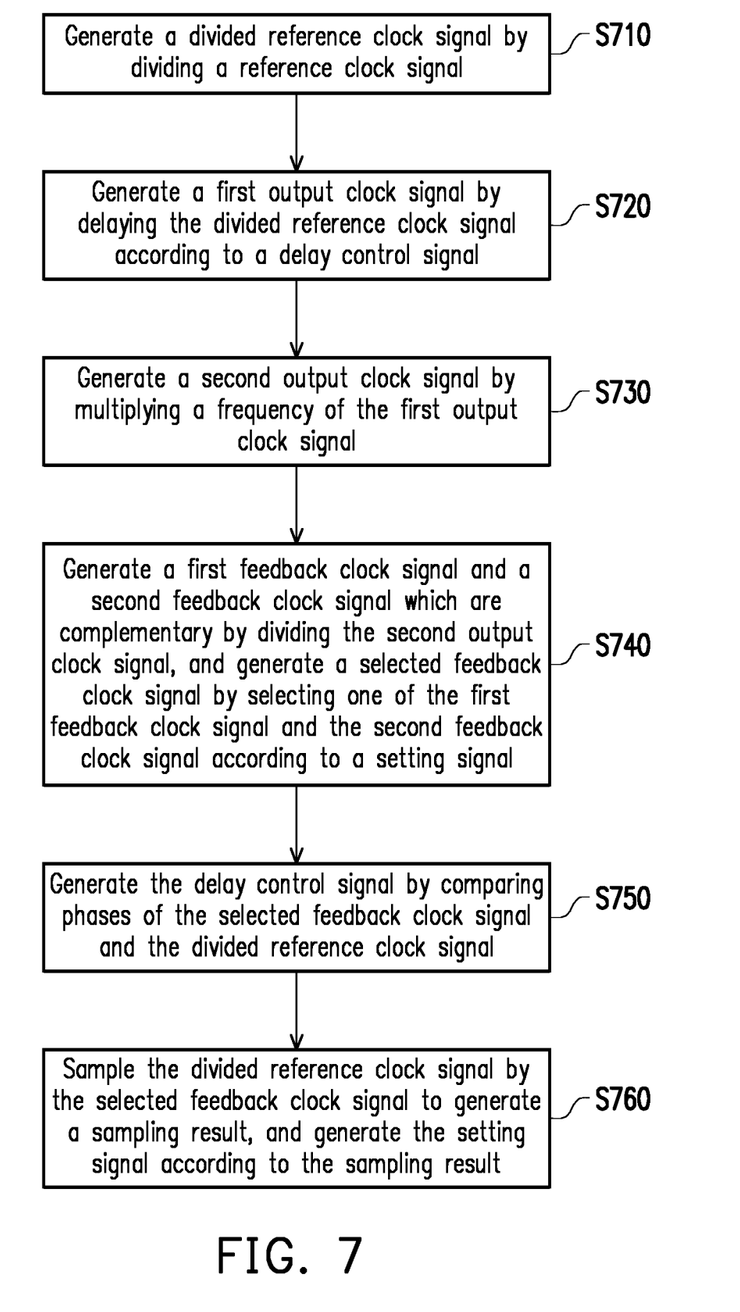
FIG. 7 is a flowchart of the phase locking method according to an embodiment of the disclosure.

Next, referring to FIG. 7, FIG. 7 is a flowchart of a phase locking method according to an embodiment of the disclosure. In Step S710, a divided reference clock signal is generated by dividing a reference clock signal; in Step S720, a first output clock signal is generated by delaying the divided reference clock signal according to a delay control signal; in Step S730, a second output clock signal is generated by multiplying the frequency of the first output clock signal; in Step S740, a first feedback clock signal and a second feedback clock signal which are complementary are generated by dividing the second output clock signal, and a selected feedback clock signal is generated by selecting one of the first feedback clock signal and the second feedback clock signal according to a setting signal; in Step S750, a delay control signal is generated by comparing the phases of the selected feedback clock signal and the divided reference clock signal; and in Step S760, the divided reference clock signal is sampled by the first feedback clock signal to generate a sampling result, and the setting signal is generated according to the sampling result.

The details for implementing the foregoing steps have been described specifically in the above embodiments and thus will not be repeated hereinafter.

In summary, according to the disclosure, the divided reference clock signal is sampled by the first feedback clock signal to generate a sampling result, and one of the first feedback clock signal and the second feedback clock signal which are complementary is selected according to the sampling result to perform the phase locking operation with the divided reference clock signal, which effectively reduces the delay value that the delay line needs to provide, reduces current consumption, and increases the locking speed.

What is claimed is:

1. A delay lock loop, comprising:
   a first divider generating a divided reference clock signal by dividing a reference clock signal;
   a delay line receiving the divided reference clock signal and a delay control signal, and generating a first output clock signal by delaying the divided reference clock signal according to the delay control signal;
   a frequency multiplier generating a second output clock signal by multiplying a frequency of the first output clock signal;
   a second divider generating a first feedback clock signal and a second feedback clock signal which are complementary by dividing the second output clock signal, and generating a selected feedback clock signal by selecting one of the first feedback clock signal and the second feedback clock signal according to a setting signal;

a phase detection and controlling circuit generating the delay control signal by comparing phases of the selected feedback clock signal and the divided reference clock signal; and a setting signal generator sampling the divided reference clock signal by the first feedback clock signal to generate a sampling result, and generating the setting signal according to the sampling result.

2. The delay lock loop according to claim 1, wherein the setting signal generator samples the divided reference clock signal according to a transition edge of the first feedback clock signal to generate the sampling result.

3. The delay lock loop according to claim 2, wherein when the transition edge is a rising edge and the sampling result is a high logic level, the setting signal generator generates the setting signal at a first logic level, and the second divider generates the selected feedback clock signal by selecting the second feedback clock signal according to the setting signal.

4. The delay lock loop according to claim 3, wherein when the transition edge is a rising edge and the sampling result is a low logic level, the setting signal generator generates the setting signal at a second logic level, and the second divider generates the selected feedback clock signal by selecting the first feedback clock signal according to the setting signal.

5. The delay lock loop according to claim 1, wherein the setting signal generator is a flip-flop, wherein a clock end of the flip-flop receives the first feedback clock signal, a data end of the flip-flop receives the divided reference clock signal, and an output end of the flip-flop generates the sampling result.

6. The delay lock loop according to claim 1, further comprising:

a load simulation circuit coupled between an output end of the delay lock loop and the second divider.

7. The delay lock loop according to claim 1, wherein the setting signal generator further receives a delay lock loop reset signal, and determines whether to perform a sampling operation according to the delay lock loop reset signal.

8. The delay lock loop according to claim 1, wherein the first divider and the second divider provide a same frequency division number, and the frequency division number is the same as a frequency multiplication number provided by the frequency multiplier.

9. The delay lock loop according to claim 1, further comprising:

a clock signal receiver receiving an input clock signal, and generating the reference clock signal according to the input clock signal.

10. A phase locking method, comprising:

generating a divided reference clock signal by dividing a reference clock signal;

generating a first output clock signal by delaying the divided reference clock signal according to a delay control signal;

generating a second output clock signal by multiplying a frequency of the first output clock signal;

generating a first feedback clock signal and a second feedback clock signal which are complementary by dividing the second output clock signal, and generating a selected feedback clock signal by selecting one of the first feedback clock signal and the second feedback clock signal according to a setting signal;

generating the delay control signal by comparing phases of the selected feedback clock signal and the divided reference clock signal; and sampling the divided reference clock signal by the first feedback clock signal to generate a sampling result, and generating the setting signal according to the sampling result.

11. The phase locking method according to claim 10, wherein sampling the divided reference clock signal by the first feedback clock signal to generate the sampling result comprises:

sampling the divided reference clock signal according to a transition edge of the first feedback clock signal to generate the sampling result.

12. The phase locking method according to claim 11, wherein when the transition edge is a rising edge and the sampling result is a high logic level, the selected feedback clock signal is generated by selecting the second feedback clock signal according to the setting signal.

13. The phase locking method according to claim 12, wherein when the transition edge is a rising edge and the sampling result is a low logic level, the selected feedback clock signal is generated by selecting the first feedback clock signal according to the setting signal.

* * * * *